United States Patent  [19]

(12) United States Patent
Paglione et al.

(10) Patent No.: US 6,970,654 B1
(45) Date of Patent: Nov. 29, 2005

(54) OPTICAL SIGNAL GENERATOR

(75) Inventors: Robert Wayne Paglione, Robbinsville, NJ (US); Arye Rosen, Cherry Hill, NJ (US); Giora Griffel, Tenafly, NJ (US); Stewart Mark Perlow, Marlboro, NJ (US)

(73) Assignee: Sarnoff Corporation, Princeton, NJ (US)

( * ) Notice: Subject to any disclaimer, the term of this patent is extended or adjusted under 35 U.S.C. 154(b) by 384 days.

(21) Appl. No.: 09/633,671

(22) Filed: Aug. 7, 2000

Related U.S. Application Data

(60) Provisional application No. 60/147,941, filed on Aug. 5, 1999.

(51) Int. Cl.[7] .............................................. H04B 10/04
(52) U.S. Cl. ...................... 398/182; 398/183; 398/201
(58) Field of Search .................... 359/115, 116, 180, 359/181, 188, 175, 176; 398/14, 23, 182, 398/183, 200, 201

(56) References Cited

U.S. PATENT DOCUMENTS

| | | | | |
|---|---|---|---|---|
| 5,349,601 A | * | 9/1994 | Hohimer et al. ............... 372/94 |
| 5,379,309 A | * | 1/1995 | Logan, Jr. ...................... 372/18 |
| 5,546,415 A | * | 8/1996 | Delfyett et al. ................ 372/25 |
| 5,854,804 A | * | 12/1998 | Winer et al. ................ 372/38.1 |
| 5,963,567 A | * | 10/1999 | Veselka et al. ................ 372/21 |
| 6,018,536 A | * | 1/2000 | Alphonse ...................... 372/23 |
| 6,208,444 B1 | * | 3/2001 | Wong et al. .................... 398/9 |

FOREIGN PATENT DOCUMENTS

| | | | | |
|---|---|---|---|---|
| EP | 0 729 057 A2 | 8/1996 | ............. G02F 1/35 |

* cited by examiner

*Primary Examiner*—M. R. Sedighian
*Assistant Examiner*—Dzung Tran
(74) *Attorney, Agent, or Firm*—William J. Burke

(57) ABSTRACT

An apparatus for optically generating signals comprises a mode-locked optical radiation source that generates mode-locked optical radiation with emitted modes separated by approximately 10 to approximately 300 GHz. Coupled to the optical radiation source is an optical demultiplexer with a demultiplexer input, a first demultiplexer output, and a second demultiplexer output, the demultiplexer input being coupled to said mode-locked radiation source. Additionally, the apparatus comprises an optical modulator having a modulator input and a modulator output, the modulator input being coupled to the first demultiplexer output, and an optical multiplexer having a first multiplexer input, a second multiplexer input, and a multiplexer output, the first multiplexer-input being coupled to the modulator output, the second multiplexer input being coupled to said second demultiplexer output.

6 Claims, 5 Drawing Sheets

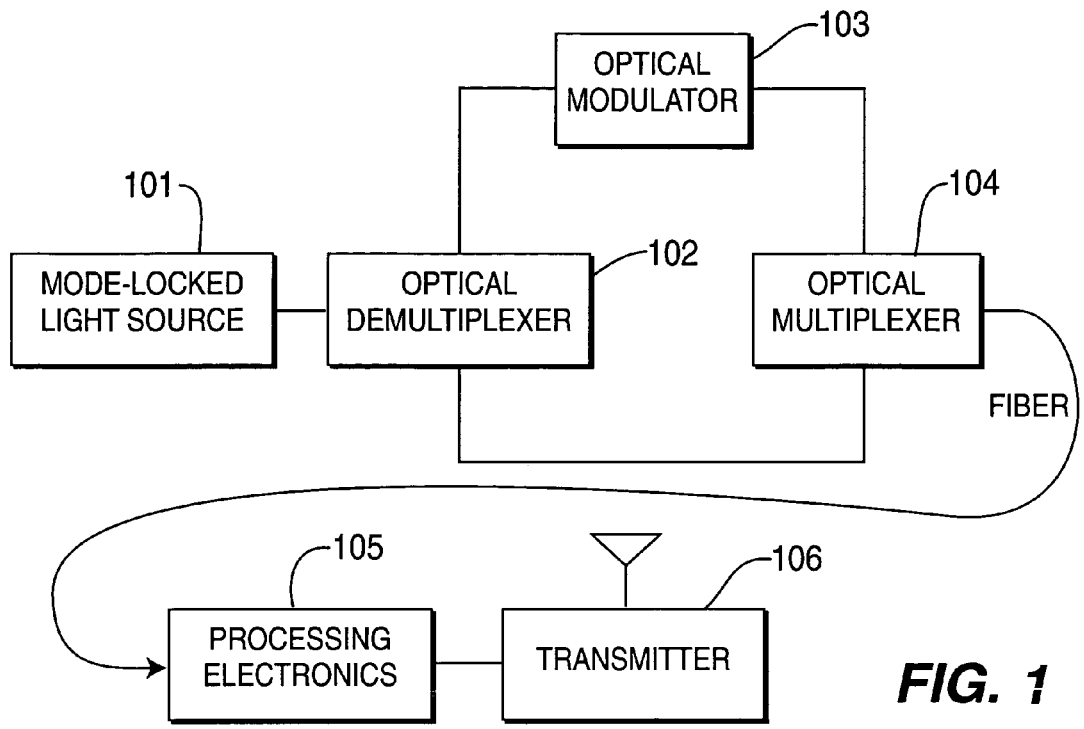
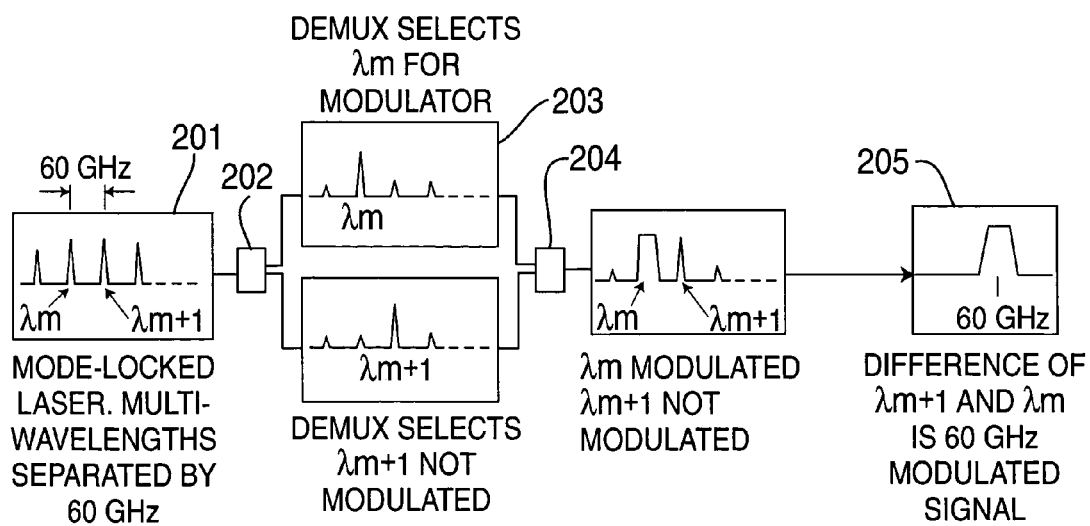
FIG. 2

SCHEMATIC DRAWING OF THE RACETRACK LASER.

THE SCHEMATIC DRAWING OF THE EPITAXIAL STRUCTURE.

A SCHEMATIC DIAGRAM OF THE WAFER VIEW SHOWN IN CROSS SECTION TAKEN FROM THE COUPLING REGION BETWEEN THE RING AND THE STRAIGHT SECTIONS.

L-I CURVE FOR THE RACETRACK LASER WITH A COUPLING LENGTH RANGING FROM 50-200μm SHOWING NEARLY THE SAME THRESHOLD CURRENT FOR ALL CONFIGURATIONS, BUT WITH IMPROVED DIFFERENTIAL EFFICIENCY FOR THE 100μm COUPLER.

LASING SPECTRUM OF THE RACETRACK LASER AT A DRIVE CURRENT I - 110 mA, SHOWING SINGLE MODE OPERATION WITH AN SMSR = 26 dB. SINGLE-MODE OPERATION IS MAINTAINED FROM THRESHOLD TO NEARLY 2 $I_{th}$.

LASING SPECTRUM AT A DRIVE CURRENT I - 140 mA, AN ABRUPT TRANSITION FROM SINGLE-MODE (SEE FIG. 7) TO MULTI-MODE OPERATION, APPARENTLY DUE TO SELF-PULSATING.

DUAL-ABSORBER MODE-LOCKED RACETRACK LASER FABRICATED IN GaAlAs/GaAs.

COMPUTED OUTPUT SPECTRUM OF A PASSIVELY MODE-LOCKED RACETRACK LASER.

OPTICAL SIGNAL GENERATOR

CROSS REFERENCE TO RELATED APPLICATIONS

The present application claims priority to United States Provisional Application No. 60/147,941, filed Aug. 5, 1999, which is hereby incorporated by reference.

FIELD OF THE INVENTION

The present invention relates to wireless communications systems. More particularly, the present invention relates to a method and apparatus for generating optical signals at high bandwidth.

BACKGROUND OF THE INVENTION

As wireless traffic increases, wireless networks are hard pressed to provide the bandwidth required to keep the traffic flowing efficiently. The increase in traffic has caused carriers to attempt to provide bandwidths as high as a gigabit per second, but at the present, no way exists to provide such a bandwidth over a wireless network.

An example of a known system that provides relatively high bandwidth is provided by a company called Giganet, Inc. Giganet products are known to work typically in the megabits-per-second bandwidth range, but cannot generate a modulated millimeter-wave signal necessary for providing gigabit-per-second throughput.

Thus, the known art lacks ways of providing the throughput necessary for a modern and efficient system.

SUMMARY OF THE INVENTION

To alleviate the problems in the known art, embodiments of the present invention include a gigabit wireless modulator capable of providing data throughput rates that are greater than two orders of magnitude above that of any current commercially-available technology.

In one embodiment of the present invention, an apparatus that optically generates signals is provided for creating modulated millimeter-wave signals. The apparatus includes a mode-locked optical radiation source that generates mode-locked optical radiation with emitted wavelengths separated by approximately 10 GHz to approximately 300 GHz. Connected to the radiation source is an optical demultiplexer with a demultiplexer input, a first demultiplexer output and a second demultiplexer output, the demultiplexer input being coupled to the mode-locked radiation source. In addition, an optical modulator is included, the optical modulator having a modulator input and a modulator output, the modulator input being coupled to the first demultiplexer output. Finally, in this embodiment, an optical multiplexer is included that has a first multiplexer input, a second multiplexer input, and a multiplexer output, the first multiplexer input being coupled to the modulator output, the second multiplexer input being coupled to the second demultiplexer output.

BRIEF DESCRIPTION OF THE DRAWINGS

FIG. 1 is a block diagram of a device according to an embodiment of the present invention.

FIG. 2 is a block diagram of the functional aspects of a device according to an embodiment of the present invention.

DETAILED DESCRIPTION

Figure 3:
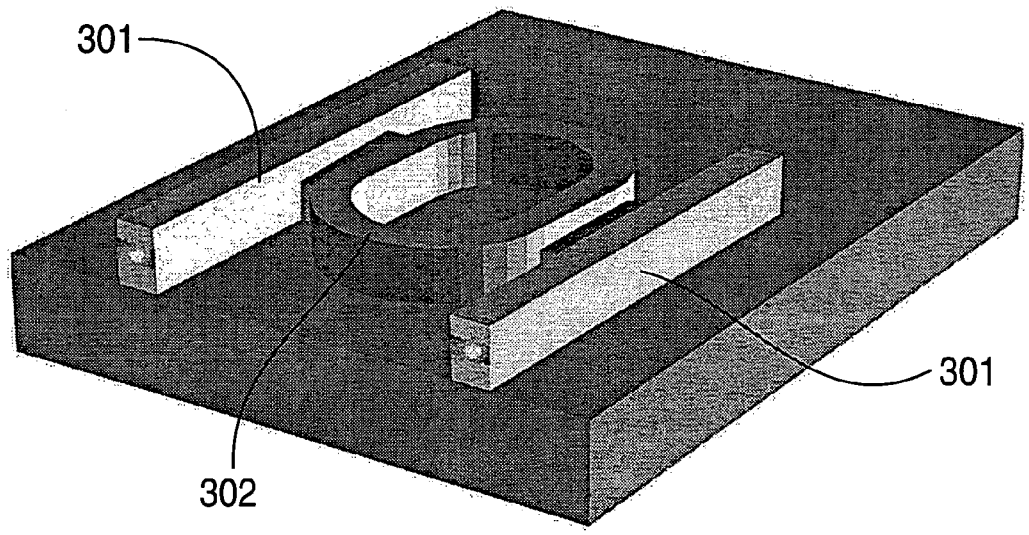
FIG. 3 is a schematic drawing of a racetrack laser, according to an embodiment of the present invention.

Embodiments of the present invention provide data-modulated millimeter-wave signals.

FIG. 1 is a block diagram of an apparatus according to an embodiment of the present invention. In this figure, mode-locked light source 101 produces light at various wavelengths that are all harmonically related to one another. The mode-locked light source is typically a mode-locked semiconductor laser, examples of which can be found in U.S. Pat. No. 6,018,536, filed on Feb. 9, 1999, the entirety of which is hereby incorporated by reference. These mode-locked semiconductor lasers are capable of emitting discrete wavelengths of light separated by a distance on the order of approximately 15 mm.

Once the light is emitted, it is coupled into optical demultiplexer 102 that acts as a wavelength filter and separator. In one embodiment, optical demultiplexer 102 can select a first wavelength for a first path, a second wavelength for a second path, and can discard the remaining wavelengths.

Optical modulator 103 can receive the light traveling along the first path, modulate that light with data, and output that light. In one embodiment of the present invention, optical modulator 103 can be a Mach-Zehnder modulator. In general, optical modulator 103 can be any type of optical modulator that is practicable for the data rates and carrier wavelengths discussed herein.

Optical multiplexer 104 can then receive, in one input, the data-modulated light from the first path, and in another input, the unmodulated light from the second path. This light can be combined and filtered in optical multiplexer 104, and transmitted over a fiber-optic cable to processing electronics 105. Processing electronics 105 can receive the combined signal, and by subtracting one of the signals from the other, can either upconvert or downconvert from the baseband data, thus creating a signal appropriate for transmission over a wireless network. Finally, the data can be passed to transmitter 106 for transmission over a wireless network.

Thus, in one embodiment of the present invention, the mode-locked semiconductor laser produces a mode-locked spectrum of narrow optical wavelengths, with each mode separated by an amount equivalent to a millimeter-wave frequency such as, for example, 0.16 nm or 20 GHz at approximately 1550 nm.

In one embodiment, optical demultiplexer 102 can be, for example, a wavelength division multiplexer (WDM) designed to separate out two of the modes in the spectrum that are, for example, 60 GHz apart. One of the modes can be modulated with high-data-rate (greater than 1 Gbps) baseband data, while the other is left unmodulated. Optical multiplexer 104 can also be a WDM, and combines the modulated and unmodulated signals.

Processing electronics 105 can include, in one embodiment of the present invention, a photodiode detector that provides the difference between the two signals. The difference can be, for example, a modulated 60 GHz signal with a bandwidth equal to the baseband data rate. The signal can then be filtered, amplified, and transmitted from a suitable antenna.

FIG. 2 is a block diagram of the functional aspects of an embodiment of the present invention. In this figure, the mode-locked laser source 201 produces a mode-locked spectrum of narrow optical wavelengths, each mode separated by an amount equivalent to, for example, a millimeter-wave frequency. For example, but not the only example, the modes can be spaced by approximately 0.48 nm at 1550 nm, which is equivalent to approximately 60 GHz.

Optical multiplexer 202 can separate out two of the modes in the spectrum. One skilled in the art will appreciate that, while FIG. 2 shows optical multiplexer 202 selecting adjacent modes, in practice, the selected modes do not have to be adjacent, as long as the selected modes are appropriately spaced. In one embodiment of the present invention, optical modulator 203 can modulate one of the modes with a data rate that can be a high data rate (e.g., greater than a Gigabit per second), while the other mode is left unmodulated.

Optical multiplexer 204 can combine the modulated and unmodulated signals, and the circuitry 205 can provide the difference between the two signals. The difference can be, in this example approximately 60 GHz with a bandwidth equal to the baseband data rate. The signal can then be filtered, amplified, and transmitted from a suitable antenna. The modulated signal can be received in the customary way, using a receiving antenna and a low-noise downconverter to recover the data.

As discussed above, mode-locked semiconductor laser 101 or 201 can be any type of mode-locked semiconductor laser. For example, mode locked semiconductor laser 101 or 201 can be the mode-locked laser disclosed in U.S. Pat. No. 6,018,536. As another example, mode-locked semiconductor laser 101 or 201 can be a semiconductor racetrack laser.

The following discussion describes mode-locked semiconductor racetrack lasers.

Semiconductor ring lasers have attracted considerable attention in the last decade because they provide compact light sources with high spectral purity, but do not require cavity definition by facet etching. As a result, these lasers can be monolithically integrated with other active or passive components to construct composite optical/electronic systems incorporating lasers, amplifiers, passive waveguides and branches, and detectors. The fabrication is relatively simple and cost-effective, and enables large-scale integration. In addition, unlike the simple Fabry-Perot or DFB type lasers, the lithography and the processing involved accurately defines the geometry of the laser cavity and its length. Thus, improved characteristics such as operating wavelength definition and tuning, spectral purity, and pulse repetition rate in mode-locked lasers, as well as concurrent operation of monolithically-integrated laser arrays with different characteristics are possible.

The semiconductor racetrack laser can perform in both a continuous-wave (CW) and single-mode operation, and can be made of materials such as InGaAsP/InP. Passive mode-locked operation in a similar geometry has been demonstrated by incorporating saturable absorbing sections within the laser cavity, and were observed operating at frequencies ranging from 28 GHZ to over 100 GHz. Active mode locking in a ring geometry can also be performed with a repetition rate of 9 GHZ.

The semiconductor racetrack laser exhibits CW single-mode operation with a side-mode suppression ratio (SMSR) better than 25 dB for a drive current ranging from threshold, at Ith=73 mA, to approximately twice the threshold value. In one embodiment of the present invention, the operating wavelength, which is determined by the material system, and to a second extent, by the vertical layered structure, can be 1.598 $\mu$m.

A schematic configuration of the racetrack laser is shown in FIG. 3. Several features of this design include the following.

The Racetrack Geometry:

By using this geometry, as opposed to a circular geometry, the coupling is enhanced from the laser to the straight sections that deliver the light generated inside the resonator to the other parts of the circuit. The straight segments of the racetrack and the straight external channels running in parallel to them form directional couplers with a coupling ratio that depends on the interaction length.

In another embodiment of the present invention, the racetrack geometry can be implemented in an AlGaAs/GaAs material system.

Bi-Level Etching:

Any known fabrication can be used to make the device. For example, a fabrication method, in which the guiding channels and the racetrack itself are defined by deep mesa etching below the active region or guiding layer, can be used to make the device. Deep etching is required for a strong confinement of the guided light, thereby reducing the bending and scattering loss in the curved sections of the racetracks. Since deep etching results in strong lateral mode confinement, it is necessary to form a very small gap between the ring resonator and the output coupling channels, on the order of 0.1 $\mu$m, to enable sufficient light coupling. This, however, implies high fabrication tolerance and stringent constraints that tend to prohibit standard lithography and mass production.

To alleviate this problem, an approach can be used in which the deep etching for waveguide definition is performed everywhere except in the coupling region. There, shallow etching is performed to a depth that is sufficient to define the two parallel channels, but is stopped just above the guiding layer to enable a stronger extension of the evanescent field from one channel to the other. As a result, the coupling is enhanced between the racetrack and the output channels, thus eliminating the need to bring the two into close proximity. In addition, this approach provides improved definition of the coupling region. This is shown in FIG. 3 by the elevated regions 301 between the racetrack 302 and the straight channels, indicating shallow etching in the coupling regions. By using this fabrication technique, bending and scattering loss in the curved sections of the racetrack, where the etching is deep, is reduced, and at the same time, strong and accurately defined coupling from the racetrack to the other parts of the photonic circuit due to the shallow etching in the coupling regions is maintained.

Processing and Experimental Results

Figure 4:
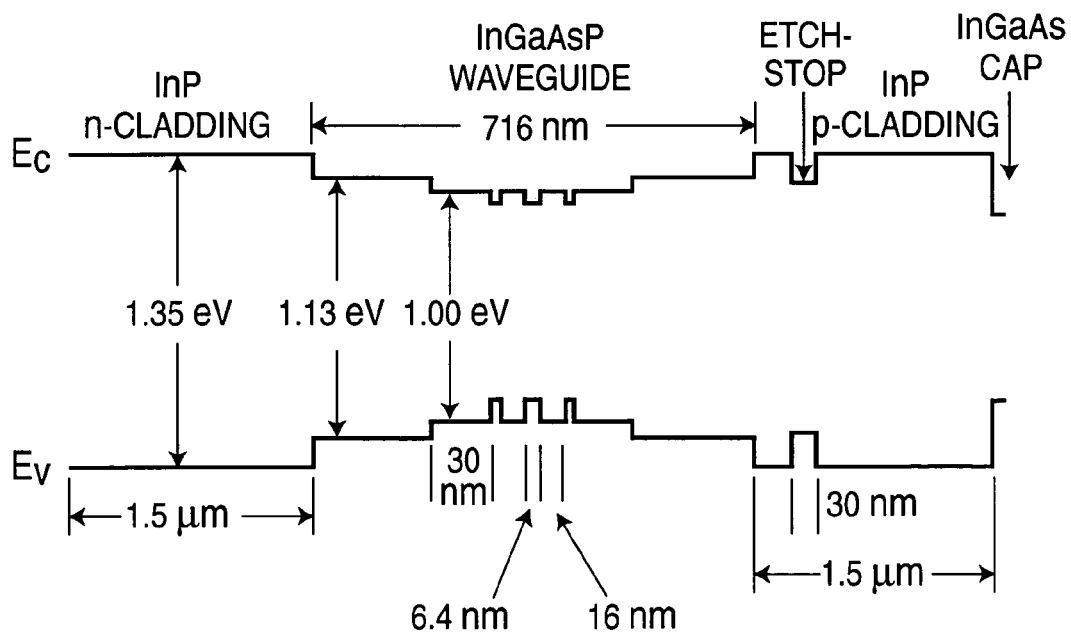
FIG. 4 is a schematic drawing of the epitaxial structure of a racetrack laser, according to an embodiment of the present invention.

The schematic drawing of the epitaxial structure is shown in FIG. 4, according to one embodiment of the present invention. In this embodiment, three compressively strained InGaAsP quantum wells are imbedded in a 716 nm wide waveguide region. The waveguide region also contains a stepped refractive index profile made up of two compositions of InGaAsP, E.g.=1.13 eV and 1.00 eV. Cladding layers of the InP (E.g.=1.35 eV) confine the optical mode to the waveguide layer. An InGaAsP etch-stop layer is positioned in the p-cladding layer to set the ridge height in a ridge waveguide laser to a value that will support the fundamental lateral optical mode.

In one embodiment of the present invention, the fabrication process for the ring laser involves a number of steps that are not standard to conventional ridge waveguide laser processing. These steps include liftoff metal deposition of closely spaced lines and both shallow and deep etching with no feature undercutting.

Figure 5:
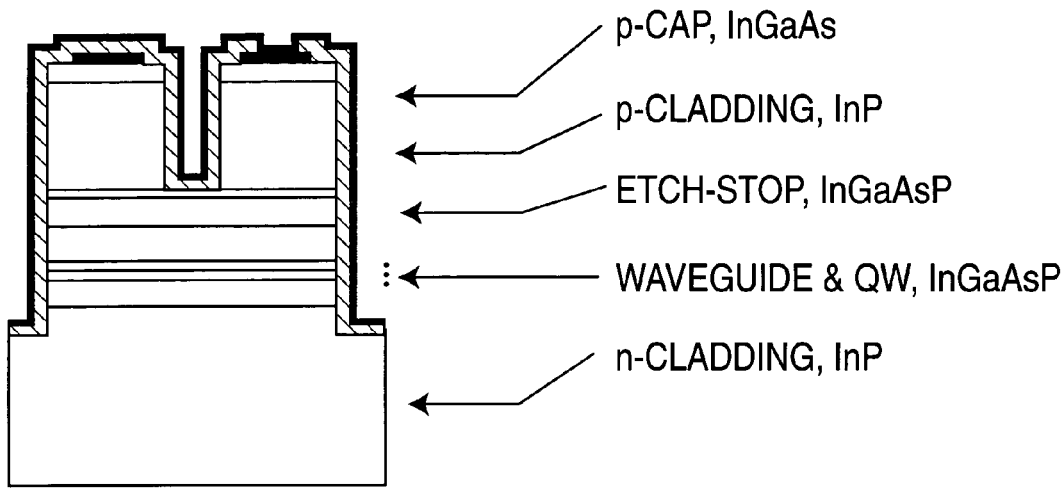
FIG. 5 shows the schematic diagram of the wafer view shown in cross section taken at the coupling region between the ring and the straight sections, according to one embodiment of the present invention.

FIG. 5 shows the schematic diagram of the wafer view shown in cross section taken at the coupling region between the ring and the straight sections, according to one embodiment of the present invention. In the figure, one can see the bi-level etching on both sides of the guiding channels. This is done by first defining the planar waveguiding geometry using a reactive timed H2-CH4 plasma etch to remove the p-cladding layer (InP) down to the upper boundary of the guiding layer. The coupling region is then covered by a second dielectric layer, Si3N4.

Figure 6:
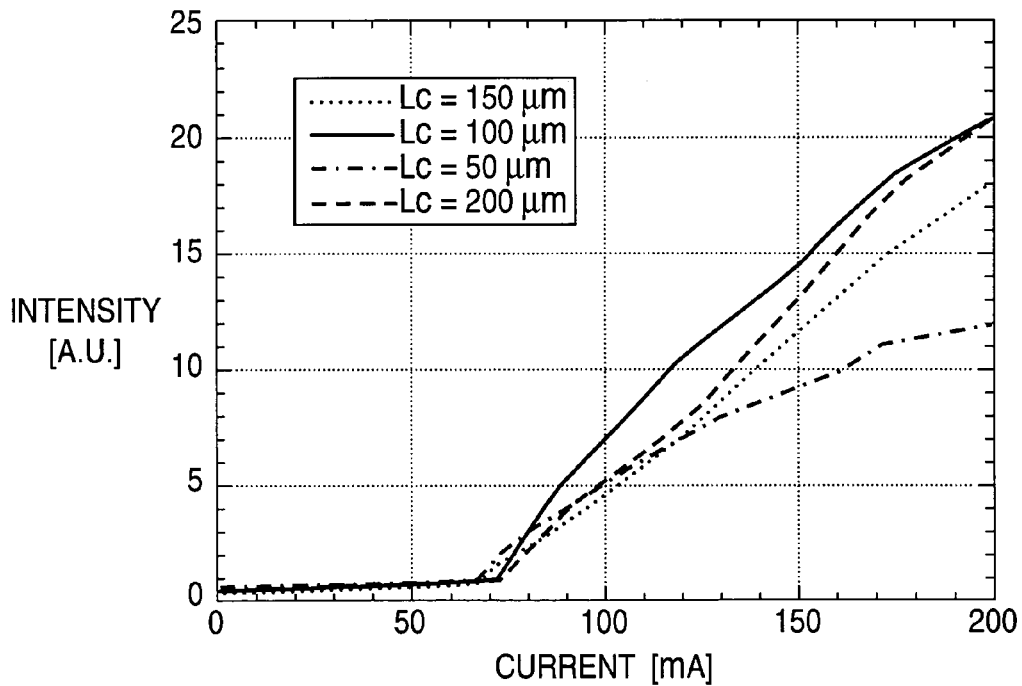
FIG. 6 displays intensity as a function of current (the L-I curves), according to various embodiments of the present invention.

In one embodiment, racetrack lasers were fabricated with directional couplers having four different lengths: 50 $\mu$m, 100 $\mu$m, 150 $\mu$m, and 200 $\mu$m. The L-I curves for these devices are shown in FIG. 6, according to various embodiments of the present invention. It is shown that the threshold current for all of the devices is nearly the same, which indicates that the main sources of loss in these lasers are within the resonator itself and could be attributed to wall roughness scattering, bending loss and mode transitions at the boundary between the straight and the curved segments of the resonators. The differential quantum efficiency is significantly better for the 100 $\mu$m long coupler.

Figure 7:
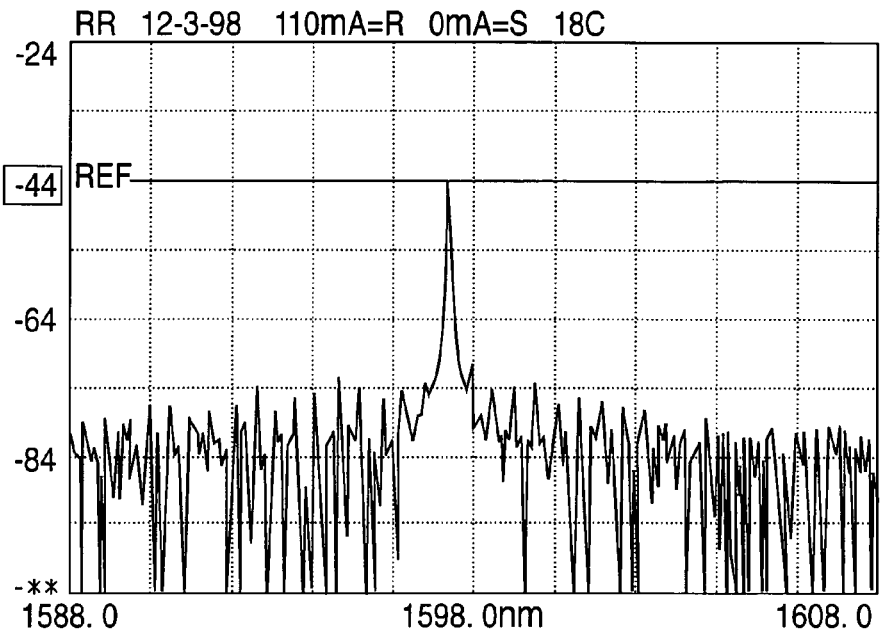
FIG. 7 displays the lasing spectrum of a racetrack laser, according to an embodiment of the present invention.
Figure 8:
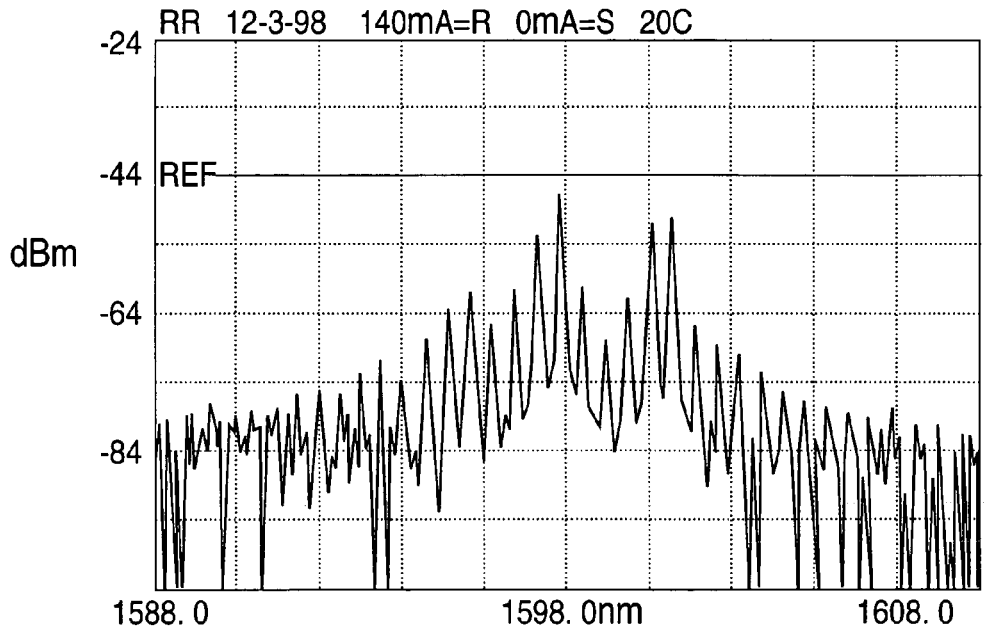
FIG. 8 displays a lasing spectrum of a racetrack laser, according to an embodiment of the present invention.

The threshold current value for the 100 $\mu$m long coupler is Ith=73 mA, which is less than half the value demonstrated previously for InP ring lasers, and comparable to the values obtained for AlGaAs racetrack lasers. The CW spectrum of the racetrack laser with the 100 $\mu$m long coupler is shown in FIG. 7, according to an embodiment of the present invention. The laser exhibits single-mode operation with a side-mode suppression ratio of better than 26 dB. This characteristic is demonstrated for current levels ranging from threshold to nearly twice the threshold current. As shown in FIG. 8, at a drive current of 140 mA the spectrum changes abruptly to multi-mode, indicating transition to a self-pulsating passively mode-locked operation.

Mode Locking

Figure 9:
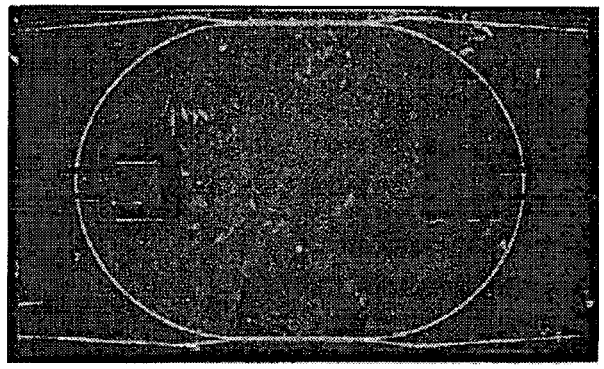
FIG. 9 shows a photograph of a racetrack laser with two saturable absorber sections fabricated in GaAlAs/GaAs QW laser, according to an embodiment of the present invention.

Racetrack semiconductor lasers are particularly suitable for applying mode-locking techniques. According to an embodiment of the present invention, the generic structure includes incorporating one or two saturable absorbing sections within the laser cavity. For example, FIG. 9 shows a photograph of a racetrack laser with two saturable absorber sections fabricated in GaAlAs/GaAs QW laser, according to an embodiment of the present invention. The cavity circumference is 3.1 mm and each of the saturable absorber sections is 50 $\mu$m long with 20 $\mu$m gap zones between the contacts on each side.

The mode-locking operation can be explained as follows: if all the sections that inject current to the cavity are forward biased, the laser operates in CW mode exhibiting, usually, a single-mode spectrum as shown in FIG. 8. If the voltage to the saturable absorber section is reversed and increased, there is a point beyond which the overall gain in a round trip is below threshold and therefore CW operation is prohibited.

A region of operation exists, however, at which there is sufficient gain in the gain section to generate enough photons that are injected into the saturable absorber section and bleach them to saturation via optical pumping. This, momentarily, provides a lasing condition and thus creates a fair amount of photons by stimulated emission that are flushing through the saturable absorber sections. This stream of photons, in turn, will cause stimulated emission within the saturable absorber section that will drain them back to the high-loss state and lasing is again inhibited. The result of this dynamic is viewed in the form of two strong light pulses that propagate clockwise and counterclockwise, respectively, in the cavity. As the front end of each light pulse arrives at a saturable absorber section, it bleaches it and enables the passage of the main part of the pulse which, in turn, causes enough stimulated emission to shut it off behind the pulse until the next time the pulse arrives.

Figure 10:
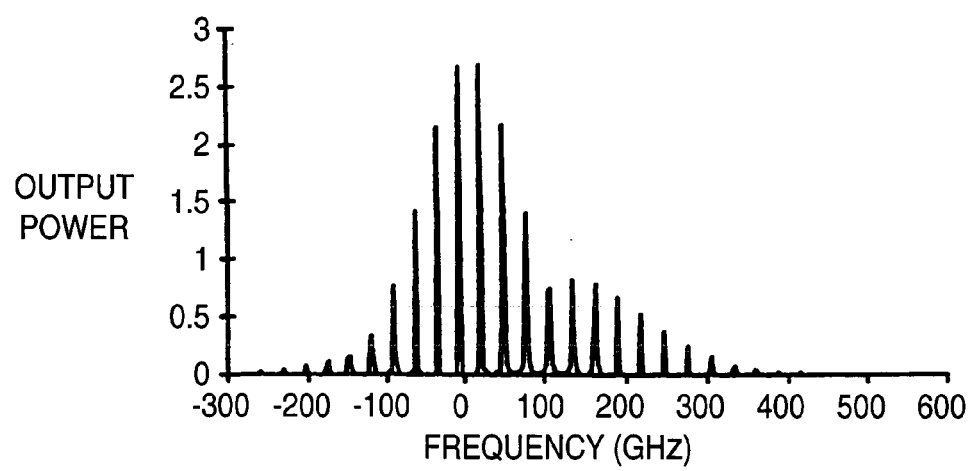
FIG. 10 displays the calculated spectrum of a racetrack-laser device, according to an embodiment of the present invention.

As light is coupled out of the cavity by the directional coupling region, a pulse train with pulse separation equivalent to the cavity round trip time is generated. For example, when the saturable absorber sections of the device shown in FIG. 9 were biased at −4V, while the gain section was pumped with an injection current of 190 mA, the laser generated a pulse train with a periodicity of 40 ps. The calculated spectrum of that device is shown in FIG. 10 showing that it exhibits multi-mode-lock operation with a corresponding mode separation of 25 GHz.

The advantages of the racetrack laser structure for generating high-frequency mode-locked signals are apparent. The oscillation frequency is set up by the round trip time that is determined by the optical path length of the laser waveguide cavity. Thus, the pulse frequency can be designed with a high degree of accuracy by the lithography of the device. As it is a monolithic structure it does not rely on an extended cavity configuration with external reflectors and thus the generated signal is less susceptible to acoustical noise. Because no output facets are required, several devices can be monolithically integrated to form a composite system. For example, an array of racetrack lasers, each having different circumferences, together with optical filters for frequency selection, can be manufactured on a single chip to provide a bank of frequencies. A successful demonstration of the system proposed here can set the stage for a monolithic system with all the optical and optoelectronic components required for the RF signal generation manufactured monolithically on a single chip.

The present invention has been described in terms of several embodiments solely for the purpose of illustration. Persons skilled in the art will recognize from this description that the invention is not limited to the embodiments described, but may be practiced with modifications and alterations limited only by the spirit and scope of the appended claims. For example, the invention is not limited to mode-locked lasers both described and incorporated into this specification. Rather, any mode-locked laser that is practicable for the purposes described herein can be used.

What is claimed is:

1. An apparatus for optically generating signals, the apparatus comprising:
   (a) a mode-locked semiconductor laser that generates mode-locked optical radiation with emitted wavelengths separated by approximately 10 GHz to approximately 300 GHz;
   (b) an optical demultiplexer with a demultiplexer input, a first demultiplexer output, and a second demultiplexer output, the demultiplexer input being coupled to said mode-locked semiconductor laser, wherein said optical demultiplexer serves as a wavelength separator capable of selecting a first wavelength for said first demultiplexer output and a second wavelength for said second demultiplexer output;
   (c) an optical modulator having a modulator input and a modulator output, the modulator input being coupled to the first demultiplexer output; and
   (d) an optical multiplexer having a first multiplexer input, a second multiplexer input, and a multiplexer output, the first multiplexer input being coupled to the modulator output, the second multiplexer input being directly coupled to said second demultiplexer output.

2. The apparatus of claim 1, wherein the mode-locked semiconductor laser is a semiconductor racetrack laser.

3. The apparatus of claim 1, wherein the optical modulator is a Mach-Zehnder modulator.

4. The apparatus of claim 1, further including processing electronics coupled to the optical multiplexer output, the processing electronics containing components necessary for downconverting the data signal received from the optical multiplexer.

5. An apparatus for generating optical signals, the apparatus comprising:
   (a) means for generating mode-locked optical radiation;
   (b) an optical demultiplexer for separating the generated mode-locked optical radiation into a first signal and a second signal, the first signal and second signal being separated by approximately 60 GHz;
   (c) means for modulating the first signal, thereby creating a modulated signal; and
   (d) means for subtracting the difference between the modulated signal and the second signal, where the second signal comprising an unmodulated signal.

6. A method for generating an optical signal, the method comprising:
   (a) generating a first mode and a second mode in a mode-locked light source;
   (b) separating the first mode from the second mode by using an optical demultiplexer, wherein said first mode comprises a first wavelength of a light from said mode-locked light source and said second mode comprises a second wavelength of said light from said mode-locked light source;
   (c) modulating the first mode with data;
   (d) combining the second mode with the modulate first mode, where the second mode comprising an unmodulated mode;
   (e) downconverting the combined second mode and modulated first mode.

* * * * *